(12) United States Patent
Kulkarni

(10) Patent No.: US 10,042,808 B1
(45) Date of Patent: Aug. 7, 2018

(54) MODELING SPI FLASH MEMORY COMMANDS IN HARDWARE

(71) Applicant: Xilinx, Inc., San Jose, CA (US)

(72) Inventor: Sanjay A. Kulkarni, Hyderabad (IN)

(73) Assignee: XILINX, INC., San Jose, CA (US)

( * ) Notice: Subject to any disclaimer, the term of this patent is extended or adjusted under 35 U.S.C. 154(b) by 380 days.

(21) Appl. No.: 14/856,322

(22) Filed: Sep. 16, 2015

(51) Int. Cl.
| | | |
|---|---|---|
| G06F 13/42 | (2006.01) | |
| G06F 12/02 | (2006.01) | |
| G06F 12/06 | (2006.01) | |
| G11C 7/10 | (2006.01) | |
| G06F 13/16 | (2006.01) | |

(52) U.S. Cl.
CPC ...... *G06F 13/4282* (2013.01); *G06F 12/0246* (2013.01); *G06F 12/0638* (2013.01); *G06F 13/1673* (2013.01); *G11C 7/1063* (2013.01); *G11C 7/1072* (2013.01); *G06F 13/1668* (2013.01); *G06F 2212/205* (2013.01); *G06F 2212/7201* (2013.01); *G11C 2216/30* (2013.01)

(58) Field of Classification Search
CPC .... G06F 13/16; G06F 13/1673; G06F 3/0685; G06F 3/0688; G06F 3/061; G06F 2212/2024; G06F 13/4282; G06F 13/1668; G11C 16/12; G11C 16/06; G11C 2216/30

See application file for complete search history.

(56) References Cited

U.S. PATENT DOCUMENTS

| | | | | |
|---|---|---|---|---|
| 5,128,666 | A * | 7/1992 | Munier | ............... G06F 13/423 340/12.13 |
| 7,281,082 | B1 | 10/2007 | Knapp | |
| 2014/0146624 | A1 * | 5/2014 | Son | ............... G11C 29/4401 365/200 |
| 2014/0181364 | A1 * | 6/2014 | Berke | ............... G06F 13/16 711/103 |

OTHER PUBLICATIONS

Xilinx, Inc., AXI Quad SPI v3.2, LogiCORE IP Product Guide, Vivado Design Suite, PG153, Nov. 19, 2014, pp. 1-101, San Jose, CA USA.

* cited by examiner

*Primary Examiner* — Ernest Unelus
(74) *Attorney, Agent, or Firm* — Robert M. Brush

(57) ABSTRACT

In an example, a serial peripheral interface (SPI) flash memory controller includes a transmit first-in-first-out (FIFO) circuit and an SPI interface operable to provide an interface between the transmit FIFO and an SPI flash memory. The SPI flash memory controller further includes a random access memory (RAM) operable to store a memory interface file, an address interface of the RAM operable to receive a command from the transmit FIFO circuit, a data interface of the RAM operable to output a control word associated with the command. The SPI flash memory controller further includes state machine logic operable to set behavior of the SPI interface based on the control word output from the RAM, where the control word includes a data direction field, a data phase field, an addressing width field, an addressing phase field, and a command error field.

14 Claims, 6 Drawing Sheets

| Command Section 302 | Address Section 304 | Dummy Section 306 | Data Section 308 |
|---|---|---|---|

| Data Direction 402 | Data Phase 404 | Addressing Width 406 | Addressing Phase 408 | Command Error 410 |

| Data Direction 402 | Data Phase 404 | Data Mode 502 | Addressing Width 406 | Addressing Phase 408 | Address Mode 504 | Command Mode 506 | Command Error 410 |

US 10,042,808 B1

MODELING SPI FLASH MEMORY COMMANDS IN HARDWARE

TECHNICAL FIELD

Examples of the present disclosure generally relate to electronic circuits and, in particular, to modeling serial peripheral interface (SPI) flash memory commands in hardware.

BACKGROUND

With the advancement in manufacturing technology, flash memories consume lower power, have smaller printed circuit board (PCB) footprints, store more data, and have longer data retention. Designers must understand how these flash memories operate in order to design associated memory controllers. The serial peripheral interface (SPI) is one type of interface to flash memory. SPI flash memory includes clock and data interface pins based on different commands. Each command is unique and exhibits dynamic behavior change at the interface-level of the memory controller. To make the behavior dynamic, it is necessary to provide the information about the command and its expected behavior on interface lines to the memory controller. Based upon the command, the memory controller can control various operating aspects of the flash memory the interface-level, such as the amount of data to send in our out, the number of dummy bytes to send, how to send the data on available interface lines, and the like.

One type of SPI flash memory controller is software-driven. Software is used to maintain the complete logic information for each command and expected behavior for the memory controller. However, the software is frequently overloaded and is configuration dependent. Software-driven SPI flash memory controllers can be slow, which significantly affects system performance.

SUMMARY

Techniques for modeling serial peripheral interface (SPI) flash memory commands in hardware are described. In an example, a serial peripheral interface (SPI) flash memory controller includes a transmit first-in-first-out (FIFO) circuit and an SPI interface operable to provide an interface between the transmit FIFO and an SPI flash memory. The SPI flash memory controller further includes a random access memory (RAM) operable to store a memory interface file, an address interface of the RAM operable to receive a command from the transmit FIFO circuit, a data interface of the RAM operable to output a control word associated with the command. The SPI flash memory controller further includes state machine logic operable to set behavior of the SPI interface based on the control word output from the RAM, where the control word includes a data direction field, a data phase field, an addressing width field, an addressing phase field, and a command error field.

In another example, an integrated circuit (IC) is coupled to a serial peripheral interface (SPI) flash memory and the IC includes an application, and an SPI flash memory controller coupled between the application and the SPI flash memory. The SPI flash memory controller includes a transmit first-in-first-out (FIFO) circuit and an SPI interface operable to provide an interface between the transmit FIFO and the SPI flash memory. The SPI flash memory controller further includes a random access memory (RAM) operable to store a memory interface file, an address interface of the RAM operable to receive a command from the transmit FIFO circuit, a data interface of the RAM operable to output a control word associated with the command. The SPI flash memory controller further includes a state machine logic operable to set behavior of the SPI interface based on the control word output from the RAM, where the control word includes a data direction field, a data phase field, an addressing width field, an addressing phase field, and a command error field.

In another example, a method of controlling a serial peripheral interface (SPI) flash memory includes receiving a command for the SPI flash memory; obtaining a control word from a random access memory in response to the command; setting behavior of an SPI interface to the SPI flash memory based on the control word output from the RAM, where the control word includes a data direction field, a data phase field, an addressing width field, an addressing phase field, and a command error field.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
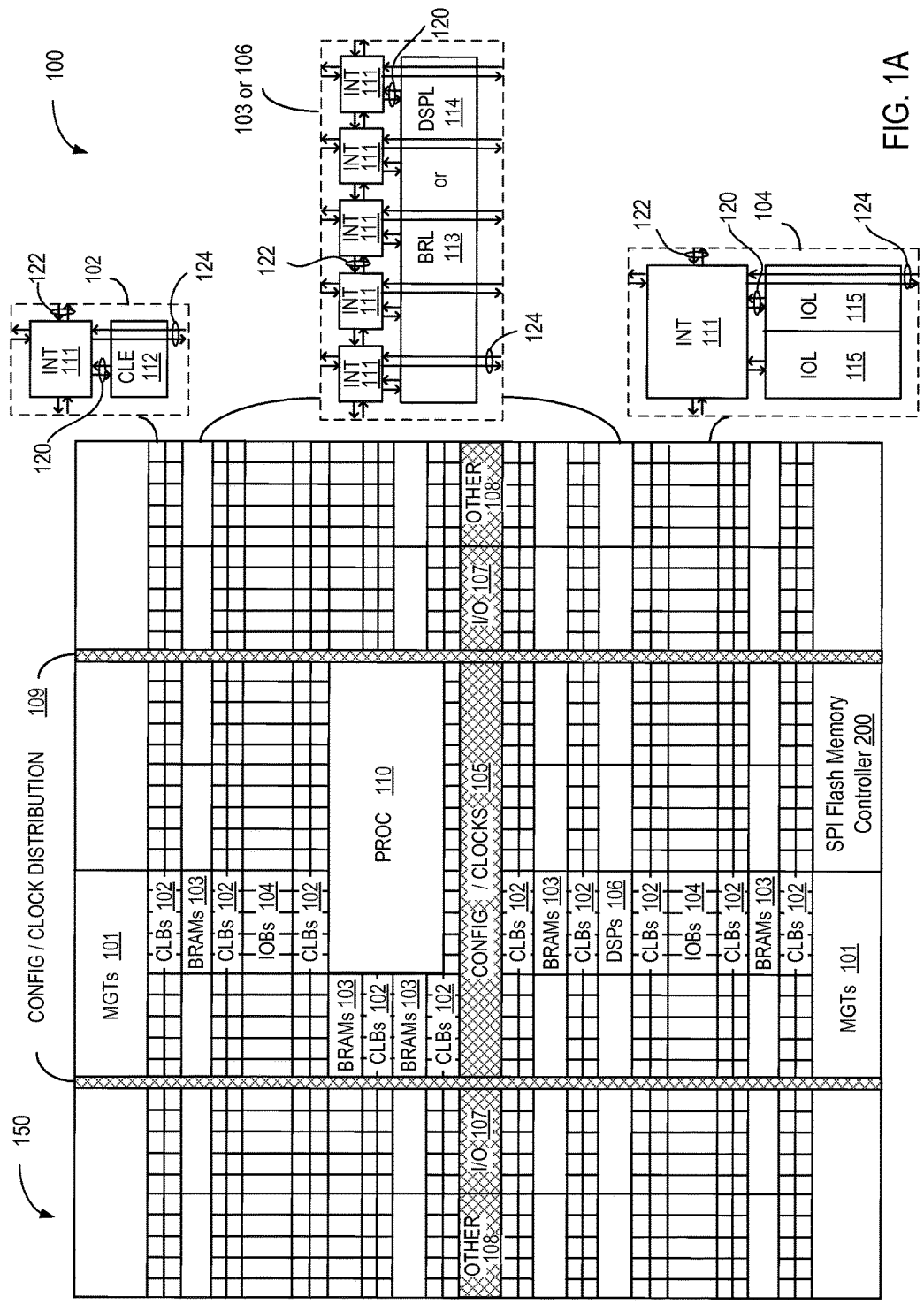
FIG. 1A illustrates an example architecture of a field programmable gate array (FPGA) that includes a serial peripheral interface (SPI) flash memory controller.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Techniques for modeling serial peripheral interface (SPI) flash memory commands in hardware are described. In an example, a hardware-based SPI flash memory controller includes built-in intelligence to respond to incoming SPI flash memory commands. The built-in intelligence is implemented without use of a large hardware decoder and is not software dependent. For various commercially available flash memories, each SPI command is eight bits wide. As such, there are 256 possible SPI commands for a given flash memory. Implementing decoder logic for 256 commands in hardware is not practical. Implementing 256 commands in software requires significant processing overhead. Accordingly, techniques described herein provide a hardware-based SPI flash memory controller that uses a hardware lookup table for each supported SPI command. The hardware lookup table can be implemented using distributed memory on an integrated circuit (IC), such as a programmable IC. Various aspects of the hardware-based SPI flash memory controller are described further below. First, however, some terminology useful in understanding the example implementations described herein is described.

SPI Protocol

The SPI protocol is popular choice of interface of many devices used in embedded systems such as serial flash memories, ADC, DAC, EEPROM's etc. The standard SPI protocol is based on a four wire interface between master and slave devices. The four wire interface includes chip select, clock, master-in-slave-out (MISO), and master-out-slave-in (MOSI) lines. The MISO and MOSI lines are unidirectional paths. The SPI protocol is driven by the device(s) capable of generating SPI transactions along with the chip select and clock. The SPI protocol is a full duplex protocol, where the master and slave SPI devices exchange data on MISO and MOSI lines with respect to the SPI clock edge. The SPI master device can send commands to the SPI slave device to perform any operation. For each SPI transaction initiated by SPI master, the SPI slave device sends some data on MISO lines which based upon the type of command or transaction SPI master will selectively reacts. The SPI clock operating speed varies from few MHz up to 108 MHz based upon the target device.

Several commercially available SPI flash memory devices extend the standard SPI protocol to support dual SPI and quad SPI modes. Such extended SPI flash memory devices include SpiFlash® memories manufactured by Winbond Electronics Corp. of Taichung City, Taiwan, Spansion® flash memories manufactured by Cypress Semiconductor of San Jose, Calif., and Numonyx® flash memories manufactured by Micron Technology, Inc. of Boise, Id. The extended devices can operate in dual SPI or quad SPI mode in addition to the standard mode. In dual SPI or quad SPI mode, the MISO and MOSI lines become bi-directional lines referred to as IO0 and IO1, respectively. In quad SPI mode, the extended SPI interface includes IO2 and IO3 lines in addition to the IO0 and IO1 lines, so the SPI interface becomes a 6 wire interface.

SPI Transactions

An SPI transaction is considered to start from assertion of the chip select line through de-assertion of the chip select line. The SPI interface can be categorized as standard SPI (or legacy SPI), dual SPI, or quad SPI, depending on the behavior. In general, each data bit is exchanged between the SPI master and SPI slave with respect to the SPI clock edge. In the standard SPI, the SPI command, address, dummy, and data bytes-to-be-written are sent to the flash memory on the MOSI (IO0) line, and the flash memory sends data on the MISO (IO1) line. Based upon the initial logic level on SPI clock, the SPI protocol is further classified as Clock Polarity (CPOL) and Clock Phase (CPHA). Majority of the SPI supporting devices, operate on either CPOL-CPHA=00 OR 11 mode. In these modes, the SPI master and SPI slave devices register each other data on rising edge of SPI clock, while these devices change own data to be driven on MISO, MOSI lines on the falling edge of SPI clock. This is the general way of SPI protocol operation.

In the dual SPI, the standard SPI commands are sent to the flash memory on the MOSI (IO0) line using the standard SPI format (1 bit per clock). For an 8-bit command, 8 SPI clocks are needed. Based upon the standard command, the address and dummy bytes are sent to the flash memory on the MOSI (IO0) line. For certain high-speed commands (dual SPI mode), the address, dummy, and data bytes are sent on both the MOSI (IO0) and MISO (IO1) lines. In the dual SPI mode, the SPI master provides the number of SPI clocks to the flash memory needed to read data from the memory or write data to the memory. For 8-bit address/dummy/data bytes in dual SPI mode, four SPI clocks are needed as opposed to eight SPI clocks in standard mode.

In the quad SPI, the standard SPI commands are sent to the flash memory on the MOSI (IO0) line using the standard SPI format (1 bit per clock). For an 8-bit command, 8 SPI clocks are needed. Based upon the standard command, the address and dummy bytes are sent to the flash memory on the MOSI (IO0) line. For certain high-speed commands (quad SPI mode), the address, dummy, and data bytes are sent on MOSI (IO0), MISO (IO1), IO2, and IO3 lines. In the quad SPI mode, the SPI master provides the number of clocks to the flash memory needed to read data from the memory or write data to the memory. For 8-bit address/dummy/data bytes in quad SPI mode, two SPI clocks are needed as opposed to eight SPI clocks in standard mode.

SPI Commands and Behavior

As discussed above, SPI commands are 8-bit commands, yielding a set of 256 possible commands. In standard SPI mode, an SPI command requires 8 SPI clocks to be transmitted from the SPI master to the SPI slave device. The SPI slave device decodes the command and operates per the command. Each command expects certain unique behavior from the SPI master device (memory controller) and the SPI slave device (SPI flash memory). Based upon the command structure, the SPI commands can be classified as standard write/read commands, dual data read commands, and quad data read commands.

Standard write/read commands can be single beat or multi-beat commands. A "beat" or "SPI beat" is a command word, address word, dummy word, or data word, depending on the command (each of these word constitute one SPI transaction which is of 8 bit wide, generally). Based on the command, the master device either reads or writes data to the slave device. All command, address, and data transactions occur serially and take eight SPI clock cycles to transmit one SPI beat.

Dual data read commands can be further classified as either normal dual or fast dual commands. The master device requires eight SPI clock cycles to transfer an SPI command. Based on the type of command chosen (either normal or fast), the address words require either a first number of SPI clock cycles (depending on address width) or half the first number of SPI clock cycles. Data read operations require 4 SPI clock cycles (per byte), as the data is presented on both the IO0 and IO1 lines by the slave device.

Quad data read commands can be further classified as either normal quad or fast quad commands. The master device requires eight SPI clock cycles to transfer an SPI command. Based on the type of command chosen (either normal or fast), the address words require either the first number of SPI clock cycles (depending on address width) or one quarter of the first number of SPI clock cycles. Data read operations require 2 SPI clock cycles (per byte), as the data is presented on all of the IO0 through IO3 lines by the slave device.

SPI Flash Memory Controller and Applications

FIG. 1A illustrates an example architecture of an FPGA 100 that includes an SPI flash memory controller 200. The FPGA 100 is one example of an IC in which the SPI flash memory controller 200 can be implemented. The SPI flash memory controller 200 can be implemented within other types of programmable ICs, such as complex programmable logic devices (CPLDs), or other types of ICs, such as application specific integrated circuits (ASICs).

The FPGA 100 includes a large number of different programmable tiles in a programmable fabric 150, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
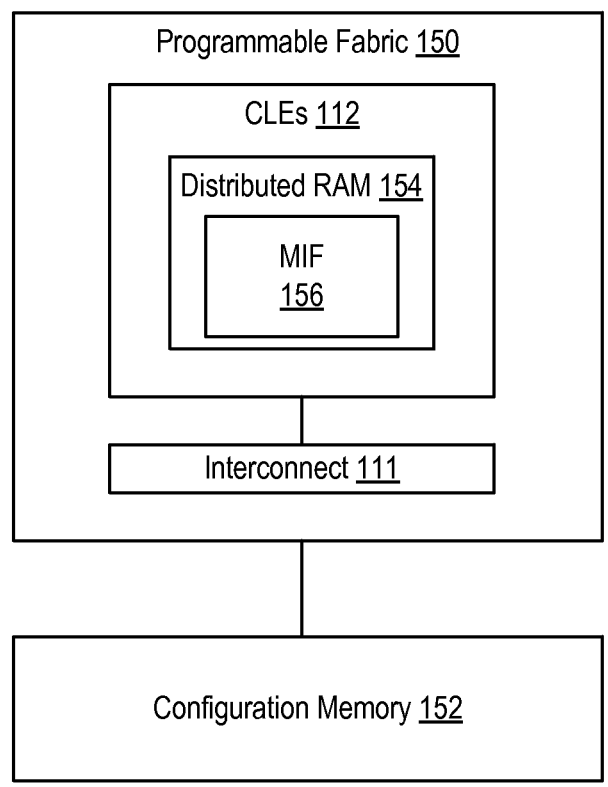
FIG. 1B is a block diagram depicting a higher-level view of the FPGA of FIG. 1A according to an example.

FIG. 1B is a block diagram depicting a higher-level view of the FPGA 100 according to an example. The programmable fabric 150 can include the various programmable tiles described above, including the CLEs 114. The programmable fabric 150 is coupled to a configuration memory 152. The configuration memory 152 comprises a random access memory (RAM), such as a static RAM (SRAM) or the like. The CLEs 112 can include look-up tables (LUTs) that implement a distributed random access memory (RAM) 154. The distributed RAM 154 can be used to store a memory initialization file (MIF) 156 that is used to control operation of the SPI flash memory controller 200, as described below. The CLEs 112 are coupled to the interconnect elements 111, as discussed above. The configuration memory 152 can be loaded with a configuration bitstream for programming ("configuring") the programmable fabric 150. For example, a configuration bitstream can be loaded into the configuration memory 152 to configure the CLEs 112 of the programmable fabric 150, as described herein.

Figure 2:
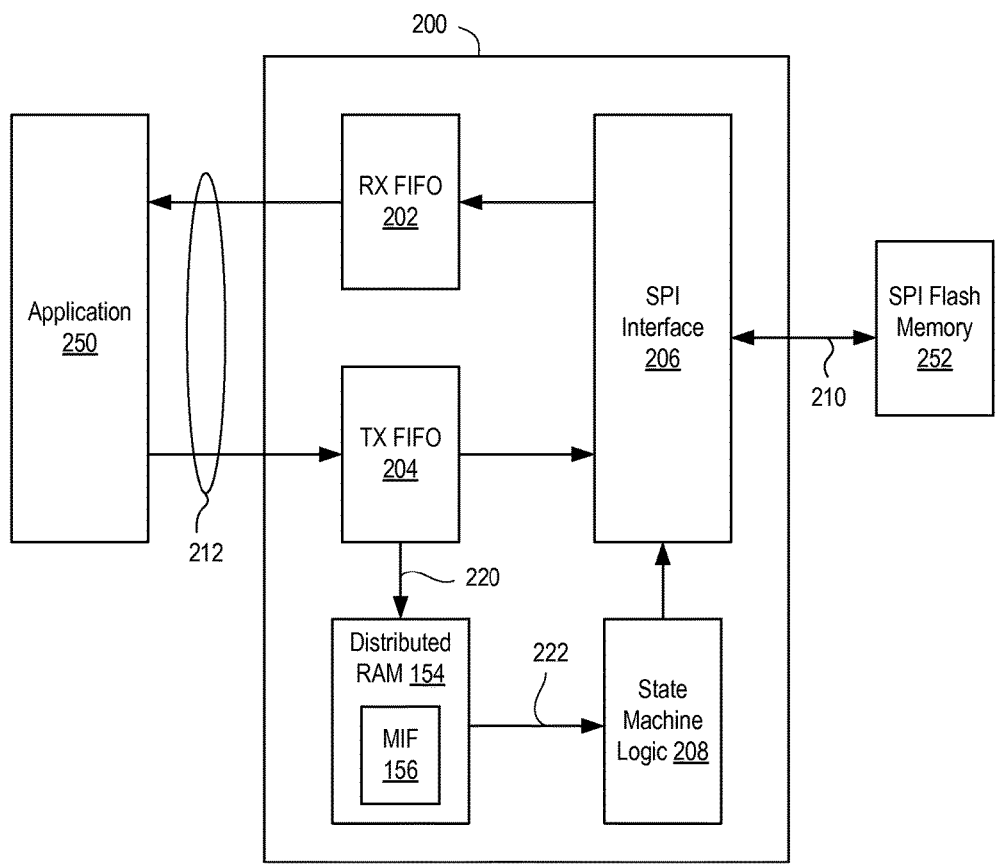
FIG. 2 is a block diagram depicting the SPI flash memory controller within the FPGA of FIG. 1A.

FIG. 2 is a block diagram depicting the SPI flash memory controller 200 according to an example. The SPI flash memory controller 200 includes a receive (RX) first-in-first-out (FIFO) circuit 202, a transmit (TX) FIFO circuit 204, an SPI interface 206, the distributed RAM 154, and a state machine logic 208. The RX FIFO and TX FIFO circuits 202 and 204 can be coupled to an application 250 through an interface 212. For example, the application 250 can comprise software executing on a processor (e.g., processor block 110) and the interface can comprise any type of peripheral interface between the SPI flash memory controller 200 and the processor. In another example, the application 250 can comprise a hardware circuit configured in the FPGA 100. The TX and RX FIFO's are of same width, which is equal to one SPI transaction (8 bit), while the depth depends upon the size of one page of flash memory (typically 256 bytes).

The TX FIFO circuit 204 is configured to store command data, address data, dummy data, and write data for an SPI flash memory 252. The SPI flash memory 252 can be any type of SPI flash memory known in the art and can be configured to operate in various modes, such as standard SPI mode, dual SPI mode, and/or quad SPI mode. The SPI interface 206 is coupled to the SPI flash memory 252 through an SPI interface 210. The SPI interface 210 can include the various SPI lines discussed above, such as MOSI (IO0), MISO (IO1), IO2, IO3, SPI clock, and chip select lines. The state machine logic 208 is operable to set the behavior of the SPI interface 206 depending on the command to be executed. The state machine logic 208 sets the behavior of the SPI interface 206 based control words on a data interface 222 of the distributed RAM 154. The distributed RAM 154 outputs control words to the state machine logic 208 based on an input SPI command received on an address interface 220 from the TX FIFO circuit 204. The input SPI command provides an address to retrieve a particular control word from the MIF 156, which is output to the state machine logic 208. The RX FIFO circuit 202 is operable to receive data from the SPI interface 206 (e.g., data read from the SPI flash memory 252). The application 250 can obtain the data read from the SPI flash memory 252 from the RX FIFO circuit 202.

As discussed above, each SPI command is a unique command in terms of the number of SPI clock cycles, the number of address beats, the number of data and/or dummy beats, the number of idle SPI clock cycles. For each command, the SPI flash memory 252 responds differently. For example, Table 1 shows four example commands, what each command does, and what is expected for each command.

TABLE 1

| Command | Hex Code | What the command does? | Command Expectation |
|---|---|---|---|
| RDID (Read ID) | 0x20h | This command reads the information related to the manufacturer specific information. | Operates in standard SPI mode, needs dummy SPI clocks based upon manufacturer to get data out of device |
| Read Data Bytes | 0x02h | Reads data from the SPI slave device starting from the location provided in address | Operates in standard SPI mode while transmitting command, address, and receiving the data. The SPI device needs the number of clocks for the length of data expected. |
| Fast Read Dual Output | 0x3Bh | Reads data from the SPI slave device starting from the location provided in the address on two lines, | Operates in the standard SPI mode while transmitting command and address bits and receives data on two lines (IO0 and IO1). |
| Fast Read Quad Output | 0x6Bh | Reads data from the SPI slave device starting from the location provided in the address on four lines. | Operates in the standard SPI mode while transmitting command and address bits and receives data on four lines (IO0-IO3). |

TABLE 1-continued

Table 1 shows four example commands of the various possible commands for an SPI flash memory and other commands are possible.

Figure 3:
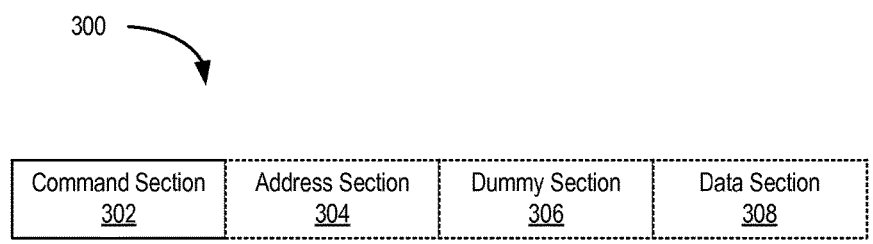
FIG. 3 is a block diagram showing an example SPI command structure.

All SPI commands to the SPI flash memory 252 are transferred in using standard SPI mode. FIG. 3 is a block diagram showing an example command structure 300. Each SPI transaction can be virtually divided into a command section 302, an optional address section 304, an optional dummy clock section 306, and an optional data section (read/write section) 308. Each section of an SPI transaction can have different requirements and the SPI interface 206 updates its behavior, based on output from the state machine logic 208, to meet the requirements of each command section of a given command being executed. The state machine logic 208 controls the SPI interface 206 based on a control word from the MIF 156 output by the distributed RAM 154 based on the command.

For example, standard SPI commands expect the following master/slave behavior. First, the command, address, and dummy beats are transferred on the MOSI (IO0) line. Data to be written to the SPI flash memory 252 is transferred on the MOSI (IO0) line. Data to be read from the SPI flash memory 252 is transferred on the MISO (IO1) line. Standard commands can be categorized into only command, command with address and data, command with data, and command with dummy bytes categories. As such, some standard commands require only the command section 302, while other commands require the address section 304, the dummy section 306, and/or the data section 308.

In another example, dual SPI commands expect the following master/slave behavior. The actual command is transferred using the standard SPI format on IO0 (MOSI). Based upon the command, some dummy SPI clocks can be transferred. Based upon the type of transaction, the address is either transferred on IO0 or on both IO0 and IO1. The read data is available on the IO0 and IO1 lines. Dual SPI commands can be categorized into commands with address and dummy bytes (for reading from memory) and commands with address and data byes (for writing to memory). As such, some dual SPI commands require the command section 302, the address section 304, and the dummy section 306, while other dual SPI commands require the command section 302, the address section 304, and the data section 308.

In another example, quad SPI commands expect the following master/slave behavior. The actual command is transferred using the standard SPI format on IO0 (MOSI). Based upon the command, some dummy SPI clocks can be transferred. Based upon the type of transaction, the address is either transferred on IO0 or on all of IO0-IO3. The read data is available on all of IO0-IO3. Quad SPI commands can be categorized into commands with address and dummy bytes (for reading from memory), commands with address and dummy bytes on four lines (for reading from memory), commands with address and without dummy bytes (for writing to memory), and commands with address and without dummy bytes on four lines (for writing to memory). As such, some quad SPI commands require the command section 302, the address section 304, and the dummy section 306, while other quad SPI commands require the command section 302, the address section 304, and the data section 308.

Figure 4:
FIG. 4 is a block diagram showing an example control word structure for the SPI flash memory controller.

FIG. 4 is a block diagram showing an example control word structure 400. The MIF 156 can include a plurality of control words having the control word structure 400. For example, the MIF (Memory Interface File) 156 can include 256 control words, one for each possible value of an 8-bit command. The control word structure 400 includes a data direction field 402, a data phase field 404, an addressing width field 406, an addressing phase field 408, and a command error field 410. Each of the fields 402-410 can comprise one bit and, as such, each control word can have a width of five bits. The definition of each of the fields is provided below in Table 2.

Figure 5:
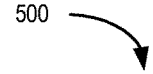
FIG. 5 is a block diagram showing another example control word structure for the SPI flash memory controller.

FIG. 5 is a block diagram showing another example control word structure 500. The control word structure 500 includes the fields 402-410 mentioned above, and additional includes a data mode field 502, an address mode field 504, and a command mode field 506. Each of the fields can comprise one bit and, as such, each control word can have a width of eight bits. The definition of each of the fields is provided below in Table 2.

The fields in the control word can be defined as follows:

TABLE 2

| Section Type | Behavior | Explanation |
|---|---|---|
| Command Error | N/A | Indicates whether command is valid SPI command. As soon as the application writes the first entry in TX FIFO, this check is done. |
| Command Mode | Possible Modes - Standard, dual, and quad SPI modes | Indicates operation mode for command section |
| Address Phase | If command has address section or not | Indicates whether command has an address |
| Address Width | Address width selection (e.g., 24 bit or 32 bit). | Indicates address width |
| Address Mode | Possible Modes - Standard, dual, and quad SPI modes | Indicates operating mode for address section |
| Data Phase | If command has data section or not | Indicates whether command has data |
| Data Mode | Possible Modes - Standard, dual, and quad SPI modes | Indicates operating mode for data section |
| Data Direction | Data input to or output from memory | Indicates whether data is written to or read from memory |

As shown in Table 2, the command error field 410 determines whether the command is a valid SPI command for the SPI flash memory 252. For example, only a subset of the 256 possible 8-bit commands may be valid commands for the SPI flash memory 252. Invalid commands can be indicated using the command error field 410. If a command is received in the TX FIFO circuit 204 that includes an invalid op-code, the corresponding control word output from the distributed RAM 154 will have the command error field 410 asserted to indicate an invalid command. The command mode field 506 can be used to indicate mode (standard, dual, or quad) for the command section 302. In some examples discussed above, all SPI commands are transmitted in standard mode. As such, in some examples, the command mode field 506 can be omitted.

The addressing phase field 408 indicates whether a given command has an address section 304. The address mode field 504 can be used to indicate the mode for the address section 304 (standard, dual, or quad). The addressing width field 406 can be used to select between two different address widths, such as between 24 or 32 bits.

The data phase field 404 indicates whether a given command has a data section 308. The data mode field 502 can be used to indicate the mode for the data section 308 (standard, dual, or quad). The data direction field 402 can be used to select between two different data directions (input to the memory or output from the memory).

Figure 6:
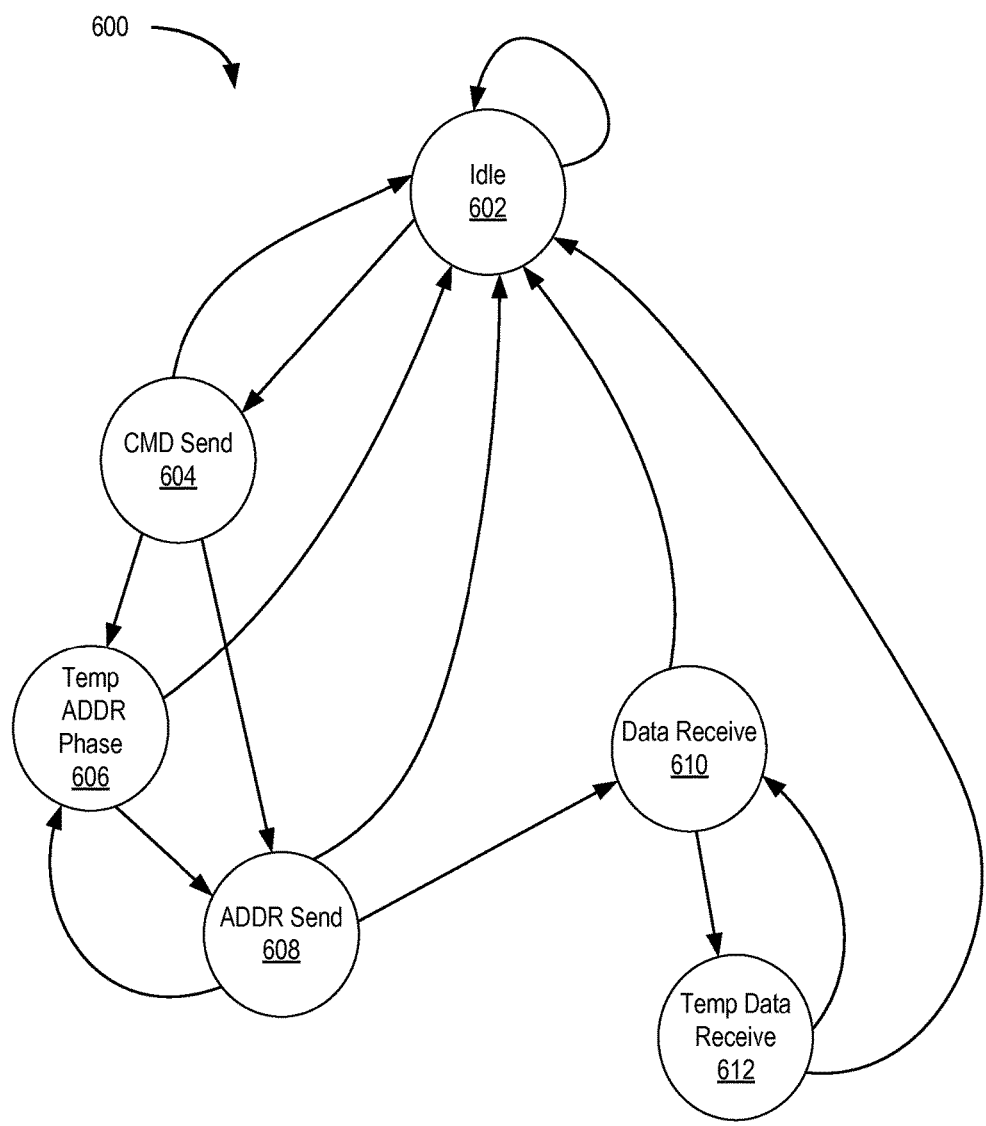
FIG. 6 is a state diagram depicting a method of operation of state machine logic in the SPI flash memory controller.

FIG. 6 is a state diagram depicting a method 600 of operation of the state machine logic 208 in the SPI flash memory controller 200. The method 600 begins at the idle state 602. If a command contains no error, the method 600 transitions from the idle state 602 to the CMD send state 604. At the CMD send state 604, the state machine logic 208 controls the SPI interface 206 to operate in a mode selected for the command section 302 (e.g., standard, dual, or quad mode or DIO/QIO mode) and to send the command to the SPI flash memory 252. The method 600 transitions from the CMD send state 604 to the temp ADDR phase state 606, the ADDR send state 608, or the idle state 602.

After the command is sent at the CMD send state 604, if the command includes an address section 304 and the TX FIFO circuit 204 has data for the address section 304, the method 600 transitions from the CMD send state 604 to the ADDR send state 608. If the command does not include an address section 304, the method 600 transitions from the CMD send state 604 to the idle state 602. If the command includes an address section 304 and the TX FIFO circuit 204 does not yet have data for the address section 304, the method 600 transitions from the CMD send state 604 to the temp ADDR phase state 606.

In the temp ADDR phase state 606, the state machine logic 208 waits for the TX FIFO circuit 204 to receive the address data for the address section 304. When the address data is received, the method 600 transitions from the temp ADDR phase state 606 to the ADDR send state 608. If, however, the chip select line is de-asserted prior to receiving the address data for the address section 304, the method 600 transitions from the temp ADDR send state 608 to the idle state 602.

In the ADDR send state 608, the state machine logic 208 controls the SPI interface 206 to operate in a mode selected for the address section 304 (e.g., standard, dual, or quad mode) and to send the address to the SPI flash memory 252. The state machine logic 208 also controls the SPI interface 206 to use the selected address width (e.g., 24 bit or 32 bit). The method 600 transitions from the ADDR send state 608 to the temp ADDR phase state 606, the data receive state 610, or the idle state 602.

In the ADDR send state 608, if the TX FIFO circuit 204 is empty but the chip select line is still asserted, the method 600 transitions from the ADDR send state 608 to the temp ADDR phase state 606. If the chip select line is de-asserted in the ADDR send state 608, the method 600 transitions to the idle state 602. If the command has a data receive phase, the state machine logic 208 controls the SPI interface 206 to receive data from the SPI flash memory 252. The method 600 then transitions from the ADDR send state to the data receive state 610.

In the data receive state 610, the state machine logic 208 controls the SPI interface 206 to keep toggling the SPI clock and receiving data from the SPI flash memory 252 as long as the TX FIFO circuit 204 includes dummy data. In the data receive state 610, if the chip select line is de-asserted, the method 600 transitions from the data receive state 610 to the idle state 602. If the chip select line remains asserted, but the TX FIFO circuit 204 does not include dummy data, the method 600 transitions from the data receive state 610 to the temp data receive state 612.

In the temp data receive state 612, if the TX FIFO circuit 204 receives dummy data and the chip select signal remains asserted, the method 600 transitions from the temp data receive state 612 to the data receive state 610. If the chip select signal is de-asserted, the method 600 transitions from the temp data receive state 612 to the idle state 602.

Figure 7:
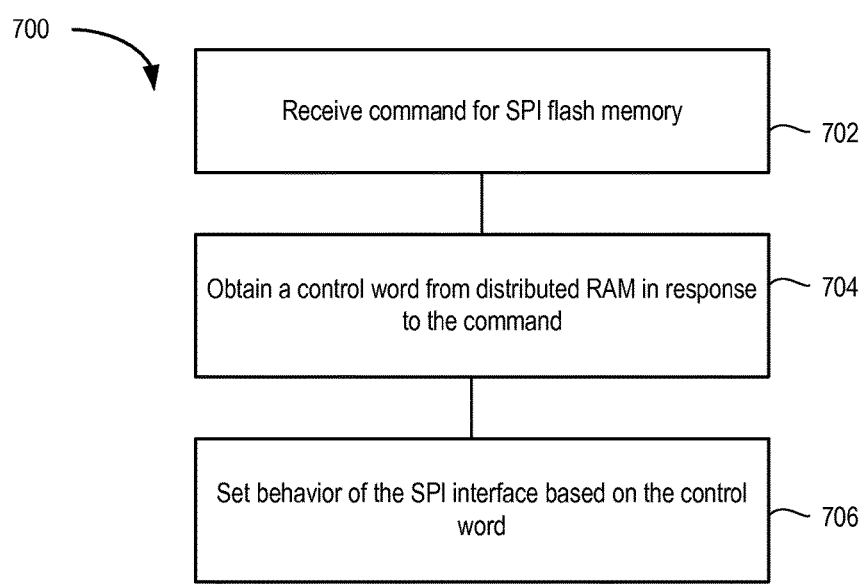
FIG. 7 is a flow diagram depicting a method of controlling an SPI flash memory according to an example.

FIG. 7 is a flow diagram depicting a method 700 of controlling an SPI flash memory according to an example. The method 700 begins at step 702, where the SPI flash memory controller 200 receives a command for the SPI flash memory 252. At step 704, the SPI flash memory controller 200 obtains a control word from the distributed RAM 154 in response to the command. At step 706, the SPI flash memory controller 200 sets the behavior of the SPI interface 206 based on the control word. In an example, the control word includes a data direction field, a data phase field, an addressing width field, an addressing phase field, and a command error field, as described above. The method 700 can be repeated for various commands.

While the foregoing is directed to specific examples, other and further examples may be devised without departing from the basic scope thereof, and the scope thereof is determined by the claims that follow.

What is claimed is:

1. A serial peripheral interface (SPI) flash memory controller, comprising:
a transmit first-in-first-out (FIFO) circuit;
an SPI interface operable to provide an interface between the transmit FIFO and an SPI flash memory;
a random access memory (RAM) operable to store a memory interface file having a plurality of control words associated with one of a standard mode, a dual mode, and a quad mode for the SPI interface, the RAM having an address interface-operable to receive a command from the transmit FIFO circuit, and a data interface operable to output a control word, of the plurality of control words, associated with the command; and
state machine logic operable to set behavior of the SPI interface based on the control word output from the RAM, where the control word includes a data direction field, a data phase field, an addressing width field, an addressing phase field, and a command error field.

2. The SPI flash memory controller of claim 1, further comprising:
a receive FIFO circuit operable to receive data from the SPI interface and read from the SPI flash memory.

3. The SPI flash memory controller of claim 1, wherein the RAM comprises a distributed RAM in an integrated circuit (IC).

4. The SPI flash memory controller of claim 1, wherein the data direction field indicates the direction of data between the SPI interface and the SPI flash memory for the command, the data phase field indicates whether the command has a data section, the addressing width field selects an address width for the command, the addressing phase field indicates whether the command has an address section, and the command error field indicates whether the command is valid.

5. The SPI flash memory controller of claim 1, wherein the SPI interface includes four data lines, a clock line, and a chip select line.

6. An integrated circuit (IC) coupled to a serial peripheral interface (SPI) flash memory, the IC comprising:

an application; and
an SPI flash memory controller coupled between the application and the SPI flash memory, the SPI flash memory controller including:
a transmit first-in-first-out (FIFO) circuit;
an SPI interface operable to provide an interface between the transmit FIFO and the SPI flash memory;
a random access memory (RAM) operable to store a memory interface file having a plurality of control words associated with one of a standard mode, a dual mode, and a quad mode for the SPI interface, the RAM having an address interface operable to receive a command from the transmit FIFO circuit, and a data interface operable to output a control word associated with the command; and
state machine logic operable to set behavior of the SPI interface based on the control word output from the RAM, where the control word includes a data direction field, a data phase field, an addressing width field, an addressing phase field, and a command error field.

7. The IC of claim 6, wherein the SPI flash memory controller further includes:
a receive FIFO circuit operable to receive data from the SPI interface and read from the SPI flash memory.

8. The IC of claim 6, wherein the RAM comprises a distributed RAM in a programmable fabric of the IC.

9. The IC of claim 6, wherein the data direction field indicates the direction of data between the SPI interface and the SPI flash memory for the command, the data phase field indicates whether the command has a data section, the addressing width field selects an address width for the command, the addressing phase field indicates whether the command has an address section, and the command error field indicates whether the command is valid.

10. The IC of claim 6, wherein the SPI interface includes four data lines, a clock line, and a chip select line.

11. A method of controlling a serial peripheral interface (SPI) flash memory, comprising:
receiving a command for the SPI flash memory;
storing a memory interface file in a random access memory (RAM), the memory interface file having a plurality of control words associated with one of a standard mode, a dual mode, and a quad mode for the SPI flash memory;
obtaining a control word of the plurality of control words from the RAM in response to the command;
setting, using a state machine, behavior of an SPI interface to the SPI flash memory based on the control word output from the RAM, where the control word includes a data direction field, a data phase field, an addressing width field, an addressing phase field, and a command error field.

12. The method of claim 11, wherein the RAM comprises a distributed RAM in programmable fabric of an integrated circuit (IC).

13. The method claim 11, wherein the data direction field indicates the direction of data between the SPI interface and the SPI flash memory for the command, the data phase field indicates whether the command has a data section, the addressing width field selects an address width for the command, the addressing phase field indicates whether the command has an address section, and the command error field indicates whether the command is valid.

14. The method of claim 11, wherein the SPI interface includes four data lines, a clock line, and a chip select line.

\* \* \* \* \*